United States Patent
Sirski et al.

(10) Patent No.: US 12,191,797 B2
(45) Date of Patent: *Jan. 7, 2025

(54) PHOTOVOLTAIC MODULE FOR A ROOF WITH CONTINUOUS FIBER TAPE

(71) Applicant: GAF Energy LLC, Parsippany, NJ (US)

(72) Inventors: William Sirski, San Jose, CA (US); Alex Sharenko, Berkeley, CA (US); David Fredric Joel Kavulak, Fremont, CA (US); Nathan Peterson, Oakland, CA (US); Hamsini Gopalakrishna, Santa Clara, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/972,401

(22) Filed: Oct. 24, 2022

(65) Prior Publication Data

US 2023/0049016 A1    Feb. 16, 2023

Related U.S. Application Data

(63) Continuation of application No. 17/675,957, filed on Feb. 18, 2022, now Pat. No. 11,496,088.

(Continued)

(51) Int. Cl.
*H02S 20/30* (2014.01)
*C09J 7/20* (2018.01)
(Continued)

(52) U.S. Cl.
CPC ............... *H02S 20/23* (2014.12); *C09J 7/20* (2018.01); *C09J 7/381* (2018.01); *E04D 5/10* (2013.01); *E04D 5/148* (2013.01)

(58) Field of Classification Search
CPC ... H02S 20/23; C09J 7/20; C09J 7/381; E04D 5/10; E04D 5/148; Y02B 10/10; Y02E 10/50
See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |

(Continued)

FOREIGN PATENT DOCUMENTS

| | | |
|---|---|---|
| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Phi D A
(74) *Attorney, Agent, or Firm* — GREENBERG TRAURIG, LLP (57) ABSTRACT

Some embodiments of the present disclosure relate to photovoltaic module for use on a roof. In some embodiments, the photovoltaic module may include a solar cell and a polymeric continuous fiber tape. In some embodiments, the polymeric continuous fiber tape comprises a polymer and glass fiber. In some embodiments, the glass fiber is present in an amount greater than about 50% by weight based on a total weight of the polymeric continuous fiber tape. In some embodiments, the polymeric continuous fiber tape comprises an elastic modulus greater than 1 GPa and an optical transmission greater than 80%.

20 Claims, 2 Drawing Sheets

Related U.S. Application Data (60) Provisional application No. 63/151,510, filed on Feb. 19, 2021.

(51) Int. Cl.

| | | |
|---|---|---|
| *C09J 7/38* | (2018.01) | |
| *E04D 5/10* | (2006.01) | |
| *E04D 5/14* | (2006.01) | |
| *H02S 20/23* | (2014.01) | |

(56) References Cited

U.S. PATENT DOCUMENTS

| | | |
|---|---|---|
| 3,581,779 A | 6/1971 | Gilbert, Jr. |
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,308,482 B1 | 10/2001 | Strait |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,579,028 B1 | 3/2020 | Jacob |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,085,187 B2 | 8/2021 | Grubka et al. |
| 11,177,639 B1 | 11/2021 | Nguyen et al. |
| 11,217,715 B2 | 1/2022 | Sharenko |
| 11,251,744 B1 | 2/2022 | Bunea |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |

(56) References Cited

U.S. PATENT DOCUMENTS

| | | |
|---|---|---|
| 11,512,480 B1 | 11/2022 | Achor et al. |
| 11,527,665 B2 | 12/2022 | Boitnott |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2005/0193673 A1 | 9/2005 | Rodrigues et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0023064 A1* | 1/2008 | Hayes .................. B32B 27/08 136/251 |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Placer et al. |
| 2009/0000222 A1 | 1/2009 | Kalkanoglu et al. |
| 2009/0014057 A1 | 1/2009 | Croft et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0325976 A1 | 12/2010 | DeGenfelder et al. |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0030386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2011/0314753 A1 | 12/2011 | Farmer et al. |
| 2012/0034799 A1 | 2/2012 | Hunt |
| 2012/0060434 A1 | 3/2012 | Jacobs |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2012/0312366 A1 | 12/2012 | Starry et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0208675 A1 | 7/2014 | Beerer et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0129032 A1* | 5/2015 | Cleereman .......... H01R 13/639 52/745.21 |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0222078 A1* | 8/2017 | Hidalgo ............... H01L 31/048 |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1* | 4/2018 | Flanigan .............. H02S 20/25 |
| 2018/0254738 A1 | 9/2018 | Yang et al. |
| 2018/0294765 A1 | 10/2018 | Friedrich et al. |
| 2018/0331652 A1* | 11/2018 | Okawa .................. H02S 30/20 |
| 2018/0351502 A1 | 12/2018 | Almy et al. |
| 2018/0367089 A1 | 12/2018 | Stutterheim et al. |
| 2019/0027624 A1 | 1/2019 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0177520 A1 | 6/2019 | Aarnio-Winterhof et al. |
| 2019/0253022 A1 | 8/2019 | Hardar et al. |
| 2019/0305717 A1 | 10/2019 | Allen et al. |
| 2019/0378943 A1* | 12/2019 | Krajewski .......... H01L 31/0481 |
| 2020/0109320 A1 | 4/2020 | Jiang |
| 2020/0144958 A1 | 5/2020 | Rodrigues et al. |
| 2020/0162017 A1 | 5/2020 | Cassagne et al. |
| 2020/0220819 A1 | 7/2020 | Vu et al. |
| 2020/0224419 A1 | 7/2020 | Boss et al. |
| 2020/0232173 A1 | 7/2020 | De Bettignies et al. |
| 2020/0266759 A1 | 8/2020 | Okawa et al. |
| 2020/0343397 A1 | 10/2020 | Hem-Jensen |

(56) References Cited

U.S. PATENT DOCUMENTS

| | | | |
|---|---|---|---|
| 2021/0083619 A1 | 3/2021 | Hegedus | |
| 2021/0115223 A1 | 4/2021 | Bonekamp et al. | |
| 2021/0159353 A1 | 5/2021 | Li et al. | |
| 2021/0234499 A1 | 7/2021 | Franco et al. | |
| 2021/0265516 A1 | 8/2021 | van Mierloo et al. | |
| 2021/0301536 A1 | 9/2021 | Baggs et al. | |
| 2021/0320615 A1 | 10/2021 | Abra et al. | |
| 2021/0343886 A1 | 11/2021 | Sharenko et al. | |
| 2021/0351311 A1 | 11/2021 | Cassagne et al. | |
| 2022/0033679 A1 | 2/2022 | Van Duijnhoven et al. | |
| 2022/0059712 A1 | 2/2022 | Barbot et al. | |
| 2022/0059713 A1* | 2/2022 | Selten | H01L 31/0481 |
| 2022/0069155 A1 | 3/2022 | Barbot et al. | |
| 2022/0115979 A1 | 4/2022 | Perkins et al. | |
| 2022/0149213 A1 | 5/2022 | Mensink et al. | |
| 2022/0149219 A1 | 5/2022 | Lemesanszkine-Piszkor et al. | |

FOREIGN PATENT DOCUMENTS

| | | | | |
|---|---|---|---|---|
| CN | 202797032 U | 3/2013 | | |
| CN | 217150978 U | 8/2022 | | |
| DE | 1958248 A1 | 11/1971 | | |
| EP | 1039361 A1 | 9/2000 | | |
| EP | 1837162 A1 | 9/2007 | | |
| EP | 1774372 A1 | 7/2011 | | |
| EP | 2446481 A2 | 5/2012 | | |
| EP | 2784241 A1 | 10/2014 | | |
| EP | 3657551 A1 | 5/2020 | | |
| EP | 3772175 A1 | 2/2021 | | |
| FR | 3063128 A1 * | 8/2018 | | E01C 17/00 |
| JP | 10046767 A | 2/1998 | | |
| JP | 2002-106151 A | 4/2002 | | |
| JP | 2001-098703 A | 10/2002 | | |
| JP | 2017-027735 A | 2/2017 | | |
| JP | 2018053707 A | 4/2018 | | |
| KR | 20090084060 A | 8/2009 | | |
| KR | 10-1348283 B1 | 1/2014 | | |
| KR | 10-2019-0000367 A1 | 1/2019 | | |
| KR | 10-2253483 B1 | 5/2021 | | |
| NL | 2026856 B1 | 6/2022 | | |
| WO | 2010/151777 A2 | 12/2010 | | |
| WO | 2011/049944 A1 | 4/2011 | | |
| WO | 2015/133632 A1 | 9/2015 | | |
| WO | 2018/000589 A1 | 1/2018 | | |
| WO | WO-2018150145 A1 * | 8/2018 | | E01C 17/00 |
| WO | 2019/201416 A1 | 10/2019 | | |
| WO | 2020-159358 A1 | 8/2020 | | |
| WO | 2021-247098 A1 | 12/2021 | | |

OTHER PUBLICATIONS

RGS Energy, 3.5KW Powerhouse 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

PHOTOVOLTAIC MODULE FOR A ROOF WITH CONTINUOUS FIBER TAPE

CROSS-REFERENCE TO RELATED APPLICATIONS

This application is a continuation of U.S. patent application Ser. No. 17/675,957, filed Feb. 18, 2022, and titled "Photovoltaic Module for a Roof with Continuous Fiber Tape," which claims priority to U.S. Provisional Application No. 63/151,510, filed on Feb. 19, 2021, and titled "Photovoltaic Module for a Roof with Continuous Fiber Tape," the entire contents of which are incorporated by reference herein in their entirety.

FIELD

The present disclosure relates to photovoltaic modules for roofs with continuous fiber tape and methods of manufacturing photovoltaic modules with continuous fiber tape.

BACKGROUND

Some roofing systems include photovoltaic modules. In some instances, the photovoltaic modules may include solar cells and regions for protecting the solar cells.

SUMMARY

Covered embodiments are defined by the claims, not this summary. This summary is a high-level overview of various aspects and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification, any or all drawings, and each claim.

Some embodiments of the present disclosure are directed to a photovoltaic module for use on a roof, the photovoltaic module comprising: a solar cell, and a polymeric continuous fiber tape, wherein the polymeric continuous fiber tape comprises a polymer; and glass fiber, wherein the glass fiber is in an amount greater than about 55% by weight based on a total weight of the polymeric continuous fiber tape; and wherein the polymeric continuous fiber tape comprises an elastic modulus greater than 1 GPa; and an optical transmission greater than 80%.

In some embodiments, the glass fiber is in an amount from 55% by weight to 70% by weight based on a total weight of the polymeric continuous fiber tape.

In some embodiments, when the photovoltaic module is installed on a roof, the roof comprises a class A fire resistance rating according to UL 790.

In some embodiments, the polymeric continuous fiber tape comprises a flammability rating of V-2 to 5 VA when tested according to UL 94.

In some embodiments, the polymeric continuous fiber tape comprises a dielectric strength from 20 kV/mm to 50 kV/mm when tested according to ASTM D149.

In some embodiments, the optical transmission of the polymeric continuous fiber tape is from 80% to 95%.

In some embodiments, the glass fiber comprises continuous glass fiber.

In some embodiments, the glass fiber comprises unidirectional glass fiber.

In some embodiments, the glass fiber comprises extruded glass fiber.

In some embodiments, the polymeric continuous fiber tape comprises a flexure strength in a direction of the continuous glass fiber from 150 MPa to 500 MPa according to ASTM D7624.

In some embodiments, the polymer comprises polyolefin.

In some embodiments, the polymeric continuous fiber tape comprises a thickness from 100 µm to 1000 µm.

In some embodiments, the polymeric continuous fiber tape comprises a thickness from 200 µm to 500 µm.

Some embodiments of the present disclosure are directed to a method comprising: obtaining glass fiber tape; obtaining a polymer; and combining the glass fiber tape and the polymer so as to form a polymeric continuous fiber tape comprising: glass fiber in an amount greater than about 55% by weight based on a total weight of the polymeric continuous fiber tape; an elastic modulus greater than 1 GPa; and an optical transmission greater than 80%.

In some embodiments, the glass fiber tape comprises extruded glass fiber tape.

In some embodiments, combining the glass fiber tape and the polymer includes combining the glass fiber tape and the polymer using a melt impregnation process.

In some embodiments, the glass fiber is in an amount from 55% by weight to 70% by weight based on a total weight of the polymeric continuous fiber tape.

In some embodiments, the optical transmission of the polymeric continuous fiber tape is from 80% to 95%.

In some embodiments, the glass fiber comprises continuous glass fiber.

In some embodiments, the glass fiber comprises unidirectional glass fiber.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, terms such as "comprising" "including," and "having" do not limit the scope of a specific claim to the materials or steps recited by the claim.

As used herein, the term "consisting essentially of" limits the scope of a specific claim to the specified materials or steps and those that do not materially affect the basic and novel characteristic or characteristics of the specific claim.

As used herein, terms such as "consisting of" and "composed of" limit the scope of a specific claim to the materials and steps recited by the claim.

As used herein, the term "continuous fiber" means an elongated strand of fiber.

As used herein, the term "tape" refers to a strip of material that is configured to adhere to a material.

As used herein, the term "continuous fiber tape" refers to a composite tape that includes continuous fiber.

As used herein, the term "polymeric continuous fiber tape" refers to a composite tape that includes a polymer and continuous fiber.

All prior patents, publications, and test methods referenced herein are incorporated by reference in their entireties.

Some embodiments of the present invention relate to a photovoltaic module. In some embodiments the photovoltaic module may be sized and/or shaped for use on a roof. In some embodiments, the photovoltaic module may be a solar panel. In some embodiments, the photovoltaic module may be a solar shingle. In some embodiments, the photovoltaic module may be a solar shingle that may be a comparable size and/or shape to asphalt shingles.

In some embodiments, the photovoltaic module includes a solar cell. In some embodiments, the photovoltaic module includes a plurality of solar cells. In some embodiments, the solar cell may include a top surface and a bottom surface. In some embodiments, the photovoltaic module may include at least one region stacked on the top surface of the solar cell. In some embodiments, the photovoltaic module may include at least one region stacked on the bottom surface of the solar cell.

In some embodiments, at least one region stacked on the top and/or bottom surface of the solar cell may include a polymeric continuous fiber tape. In some embodiments, the polymeric continuous fiber tape may include a polymer. In some embodiments, the polymer may include polyolefin, cyclic polyolefin, ethylene-vinyle acetate ("EVA"), polyurethane, epoxy, polyester, acrylic, or any combination thereof.

In some embodiments, the polymeric continuous fiber tape may include glass fiber. In some embodiments, the polymeric continuous glass fiber tape may include a sufficient amount of glass fiber so as to result in the polymeric continuous fiber tape comprising an elastic modulus greater than 1 Gpa when tested according to ASTM D638 and an optical transmission greater than 80%. In some embodiments, when the photovoltaic module is installed on a roof, the roof comprises a class A fire resistance rating according to UL 790.

In some embodiments, the sufficient amount of glass fiber may be an amount greater than 50% by weight based on a total weight of the polymeric continuous glass fiber tape. In some embodiments, the sufficient amount of glass fiber may be an amount greater than 55% by weight based on a total weight of the polymeric continuous glass fiber tape. In some embodiments, the sufficient amount of glass fiber may be an amount of 55% by weight to 90% by weight, of 55% by weight to 80% by weight, of 55% by weight to 70% by weight, or of 55% by weight to 60% by weight based on a total weight of the polymeric continuous glass fiber tape. In some embodiments, the sufficient amount of glass fiber may be an amount of 60% by weight to 90% by weight, of 70% by weight to 90% by weight, or of 80% by weight to 90% by weight based on a total weight of the polymeric continuous glass fiber tape. In some embodiments, the sufficient amount of glass fiber may be an amount of 60% by weight to 80% by weight based on a total weight of the polymeric continuous glass fiber tape.

In some embodiments, the polymeric continuous fiber tape with the sufficient amount of glass fiber has an optical transmission greater than 80%. In some embodiments, the polymeric continuous fiber tape has an optical transmission of 80% to 100%, of 80% to 95%, of 80% to 90%, of 80% to 85%, of 85% to 100%, of 90% to 100%, of 95% to 100%, or of 85% to 95%.

In some embodiments, the percent of optical transmission may be determined using a spectrophotometer, including for example, a PerkinElmer® Lambda 1050 spectrophotometer. In some embodiments, the percent of optical transmission may be determined using a spectrophotometer with an integrating sphere, including for example, a 270 mm integrating sphere.

In some embodiments, the polymeric continuous fiber tape with the sufficient amount of glass fiber has a dielectric strength greater than 20 kV/mm when tested according to ASTM D149. In some embodiments, the polymeric continuous fiber tape with the sufficient amount of glass fiber has a dielectric strength of 20 kV/mm to 50 kV/mm when tested according to ASTM D149, of 20 kV/mm to 45 kV/mm when tested according to ASTM D149, of 20 kV/mm to 40 kV/mm when tested according to ASTM D149, of 20 kV/mm to 35 kV/mm when tested according to ASTM D149, of 20 kV/mm to 30 kV/mm when tested according to ASTM D149, of 20 kV/mm to 25 kV/mm when tested according to ASTM D149, of 25 kV/mm to 50 kV/mm when tested according to ASTM D149, of 30 kV/mm to 50 kV/mm when tested according to ASTM D149, of 35 kV/mm to 50 kV/mm when tested according to ASTM D149, of 40 kV/mm to 50 kV/mm when tested according to ASTM D149, of 45 kV/mm to 50 kV/mm when tested according to ASTM D149, of 25 kV/mm to 45 kV/mm when tested according to ASTM D149, or of 30 kV/mm to 40 kV/mm when tested according to ASTM D149.

In some embodiments, the polymeric continuous fiber tape comprises a thickness of 100 μm to 1000 μm, of 200 μm to 1000 μm, of 300 μm to 1000 μm, of 400 μm to 1000 μm, of 500 μm to 1000 μm, of 600 μm to 1000 μm, of 700 μm to 1000 μm, of 800 μm to 1000 μm, of 900 μm to 1000 μm, of 100 µm to 900 µm, of 100 µm to 800 µm, 100 µm to 700 µm, 100 µm to 600 µm, of 100 µm to 500 µm, of 100 µm to 400 µm, 100 µm to 300 µm, 100 µm to 200 µm, 200 µm to 900 µm, 300 µm to 800 µm, 400 µm to 700 µm, or of 500 µm to 600 µm.

In some embodiments, the polymeric continuous fiber tape comprises a thickness of 200 µm to 500 µm, of 200 µm to 450 µm, of 200 µm to 400 µm, of 200 µm to 350 µm, of 200 µm to 300 µm, of 200 µm to 250 µm, of 250 µm to 500 µm, of 300 µm to 500 µm, of 350 µm to 500 µm, of 400 µm to 500 µm, of 450 µm to 500 µm, of 250 µm to 450 µm, or of 300 µm to 400 µm.

In some embodiments, the glass fiber may be continuous glass fiber, unidirectional glass fiber, extruded glass fiber, mat glass fiber, weave glass fiber, or any combination thereof.

In some embodiments, the polymeric continuous fiber tape comprises a flexure strength in the direction of the continuous glass fiber. In some embodiments, the polymeric continuous fiber tape with the sufficient amount of glass fiber has a flexure strength in the direction of the continuous glass fiber greater than 300 Mpa. In some embodiments, the polymeric continuous fiber tape with the sufficient amount of glass fiber has a flexure strength in the direction of the continuous glass fiber of 150 Mpa to 500 Mpa according to ASTM D7624.

In some embodiments, the polymeric continuous fiber tape with the sufficient amount of glass fiber has a flexure strength in the direction of the continuous fiber of 150 Mpa to 450 Mpa, of 150 Mpa to 400 Mpa, of 150 Mpa to 350 Mpa, of 150 Mpa to 300 Mpa, of 150 Mpa to 250 Mpa, of 150 Mpa to 200 Mpa, of 200 Mpa to 500 Mpa, of 250 Mpa to 500 Mpa, of 300 Mpa to 500 Mpa, of 350 Mpa to 500 Mpa, of 400 Mpa to 500 Mpa, of 450 Mpa to 500 Mpa, of 200 Mpa to 450 Mpa, of 250 Mpa to 400 Mpa, or of 300 Mpa to 350 Mpa according to ASTM D7624.

In some embodiments, the polymeric continuous fiber tape is configured to be flame resistant. In some embodiments, the polymeric continuous fiber tape comprises a flammability rating of V-2 to 5 VA when tested according to UL 94.

In some embodiments, the polymeric continuous fiber tape may be a region stacked on the top surface of the solar cell. In some embodiments, the polymeric continuous fiber tape may be a region stacked on the bottom surface of the solar cell. In some embodiments, the photovoltaic module may include a plurality of regions of polymeric continuous fiber tape that may be stacked on the top and/or bottom surfaces of the solar cell. In some embodiments, the region of polymeric continuous fiber tape may be a single layer of polymeric continuous fiber tape. In some embodiments, the region of polymeric continuous fiber tape may include a plurality of layers of polymeric continuous fiber tape.

In some embodiments, the plurality of regions of polymeric continuous fiber tape may be stacked so that the continuous glass fiber in each region is parallel to one another. In some embodiments, the plurality of regions of polymeric continuous fiber tape may be stacked so that the continuous glass fiber in one region is perpendicular to the continuous glass fiber in another region. In some embodiments, the plurality of regions of polymeric continuous fiber tape may be stacked so that the continuous glass fiber in one region is angled relative to the continuous glass fiber in another region. In some embodiments, the angle may be 0 degrees to 90 degrees, 10 degrees to 90 degrees, 20 degrees to 90 degrees, 30 degrees to 90 degrees, 40 degrees to 90 degrees, 50 degrees to 90 degrees, 60 degrees to 90 degrees, 70 degrees to 90 degrees, 80 degrees to 90 degrees, 0 degrees to 80 degrees, 0 degrees to 70 degrees, 0 degrees to 60 degrees, 0 degrees to 50 degrees, 0 degrees to 40 degrees, 0 degrees to 30 degrees, to 0 degrees to 20 degrees, 0 degrees to 10 degrees, 10 degrees to 80 degrees, 20 degrees to 70 degrees, 30 degrees to 60 degrees, or 40 degrees to 50 degrees.

In some embodiments, the plurality of regions of polymeric continuous fiber tape may include a first polymeric continuous fiber tape, a second polymeric continuous fiber tape, and a third polymeric continuous fiber tape. In some embodiments, the first, second, and third polymeric continuous fiber tapes may be spaced apart from one another in the photovoltaic module. In some embodiments, the second polymeric continuous fiber tape may be in a region between the first polymeric continuous fiber tape and the third polymeric continuous fiber tape in the photovoltaic module.

In some embodiments, the thickness of each region of polymeric continuous fiber tape may be the same. In some embodiments, each region of polymeric continuous fiber tape may each include a different thickness.

In some embodiments, a distance between the first polymeric continuous fiber tape and the second polymeric continuous fiber tape is at least 1 mm. In some embodiments, a distance between the first polymeric continuous fiber tape and the second polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, a distance between the first polymeric continuous fiber tape and the third polymeric continuous fiber tape is at least 1 mm. In some embodiments, a distance between the first polymeric continuous fiber tape and the third polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, a distance between the second polymeric continuous fiber tape and the third polymeric continuous fiber tape is at least 1 mm. In some embodiments, a distance between the second polymeric continuous fiber tape and the third polymeric continuous fiber tape is 1 mm to 6 mm, 1 mm to 5 mm, 1 mm to 4 mm, 1 mm to 3 mm, 1 mm to 2 mm, 2 mm to 6 mm, 3 mm to 6 mm, 4 mm to 6 mm, 5 mm to 6 mm, 2 mm to 5 mm, or 3 mm to 4 mm.

In some embodiments, the photovoltaic module may include a transparent sheet. In some embodiments, the transparent sheet may be a region stacked on the top surface of the solar cell. In some embodiments, the transparent sheet may include any sufficiently transparent material, including for example, glass. In some embodiments, the photovoltaic module does not have a transparent sheet.

In some embodiments, the transparent sheet has a thickness of 10 µm to 200 µm, of 10 µm to 180 µm, of 10 µm to 160 µm, of 10 µm to 140 µm, of 10 µm to 120 µm, of 10 µm to 100 µm, of 10 µm to 80 µm, of 10 µm to 60 µm, of 10 µm to 40 µm, of 10 µm to 20 µm, of 30 µm to 200 µm, of 50 µm to 200 µm, of 70 µm to 200 µm, of 90 µm to 200 µm, of 110 µm to 200 µm, of 130 µm to 200 µm, of 150 µm to 200 µm, of 170 µm to 200 µm, of 190 µm to 200 µm, of 30 µm to 180 µm, of 50 µm to 160 µm, of 70 µm to 140 µm, or of 90 µm to 120 µm.

In some embodiments, the photovoltaic module may include an encapsulant. In some embodiments, the encapsulant may be a region stacked on the top or bottom surface of the solar cell. In some embodiments, the photovoltaic module may include a plurality of regions of encapsulant stacked on the top and/or bottom surface of the solar cell. In some embodiments, the encapsulant may include polyolefin, silicone, EVA, or any combination thereof.

In some embodiments, the encapsulant has a thickness of 200 µm to 1000 µm, of 200 µm to 900 µm, of 200 µm to 800 µm, of 200 µm to 700 µm, of 200 µm to 600 µm, of 200 µm to 500 µm, of 200 µm to 400 µm, of 200 µm to 300 µm, of 300 µm to 1000 µm, of 400 µm to 1000 µm, of 500 µm to 1000 µm, of 600 µm to 1000 µm, of 700 µm to 1000 µm, of 800 µm to 1000 µm, of 900 µm to 1000 µm, of 300 µm to 900 µm, of 400 µm to 800 µm, or 500 µm to 700 µm.

In some embodiments, the photovoltaic module may include a core. In some embodiments, the core may be a region stacked on the top or bottom surface of the solar cell. In some embodiments, the core may include closed cell foam, open cell foam, honeycomb board, a pure polymer material, including, for example, thermoplastic polyolefin, or any combination thereof.

In some embodiments, the core has a thickness of 800 µm to 2000 µm, of 900 µm to 2000 µm, of 1000 µm to 2000 µm, of 1100 µm to 2000 µm, of 1200 µm to 2000 µm, of 1300 µm to 2000 µm, of 1400 µm to 2000 µm, of 1500 µm to 2000 µm, of 1600 µm to 2000 µm, of 1700 µm to 2000 µm, of 1800 µm to 2000 µm, of 1900 µm to 2000 µm, of 800 µm to 1900 µm, of 800 µm to 1800 µm, of 800 µm to 1700 µm, of 800 µm to 1700 µm, of 800 µm to 1600 µm, of 800 µm to 1500 µm, of 800 µm to 1400 µm, of 800 µm to 1300 µm, of 800 µm to 1200 µm, of 800 µm to 1100 µm, of 800 µm to 1000 µm, of 800 µm to 900 µm, of 900 µm to 1900 µm, of 1000 µm to 1800 µm, of 1100 µm to 1700 µm, of 1200 µm to 1600 µm, or of 1300 µm to 1500 µm.

In some embodiments, the solar cell may include a top surface and a bottom surface. In some embodiments, the photovoltaic module may include at least one region stacked on the top surface of the solar cell. In some embodiments, the photovoltaic module may include at least one region stacked on the bottom surface of the solar cell.

Some embodiments of the present disclosure may relate to a method. In some embodiments, the method may include obtaining glass fiber tape. In some embodiments, the glass fiber tape may be continuous glass fiber tape, extruded glass fiber tape, unidirectional glass fiber tape, or any combination thereof.

In some embodiments, the method may include obtaining a polymer. In some embodiments, the polymer may include polyolefin, including, for example, polyethylene, polypropylene, or combinations thereof.

In some embodiments, the method may include combining the glass fiber tape and the polymer so as to form a polymeric continuous fiber tape as described herein. For example, in some embodiments, the polymeric continuous fiber tape may include glass fiber in amount greater than 55% by weight based on a total weight of the polymeric continuous fiber tape, a strength module greater than 1 Gpa, and an optical transmission greater than 80%.

In some embodiments, the glass fiber tape and the polymer may be combined using a melt impregnation process. In some embodiments, the melt impregnation process includes impregnating the glass fiber tape with the polymer so as to form the polymeric continuous fiber tape.

The present disclosure will now be described with reference to non-limiting exemplary embodiments depicted in FIGS. 1-3.

Figure 1:
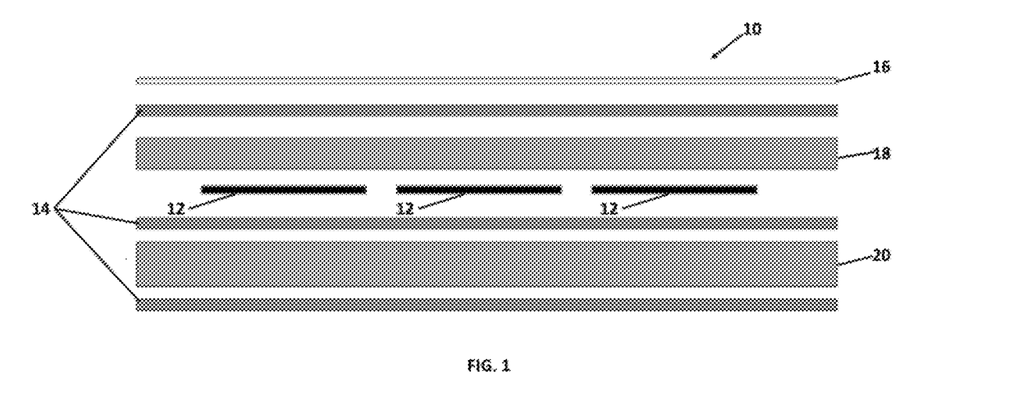
FIG. 1 depicts an exploded cross-sectional view of an exemplary embodiment of a photovoltaic module.

FIG. 1 depicts an exploded cross-sectional view of an exemplary embodiment of a photovoltaic module 10. As shown in FIG. 1, the photovoltaic module includes a plurality of solar cells 12 and a plurality of regions 14, 16, 18, 20 stacked above and below the solar cells 12. In the exemplary embodiment of FIG. 1, the plurality of regions includes three regions of polymeric continuous fiber tape 14. As shown in FIG. 1, the polymeric continuous fiber tape 14 is disposed in the photovoltaic module 10 above and below the solar cells 12. In addition, the plurality of regions includes a transparent sheet 16, an encapsulant 18, and a core 20.

Figure 2:
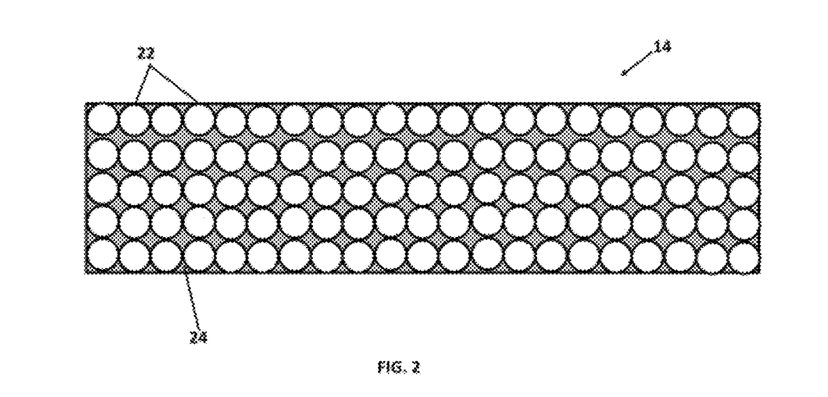
FIG. 2 depicts a cross-sectional view of an exemplary embodiment of a polymeric continuous fiber tape.

FIG. 2 depicts a cross-sectional view of an exemplary embodiment of a polymeric continuous fiber tape 14. As shown in FIG. 2, the polymeric continuous fiber tape includes glass fiber 22. In the exemplary embodiment of FIG. 2, the glass fiber 22 is continuous glass fiber, which may be unidirectional and distributed throughout the polymeric continuous fiber tape. In addition, as shown in FIG. 2, the polymeric continuous fiber tape includes a polymer 24. In the exemplary embodiment of FIG. 2, the polymer 24 may be a polyolefin. The polyolefin may be impregnated in the polymeric continuous fiber tape.

Figure 3:
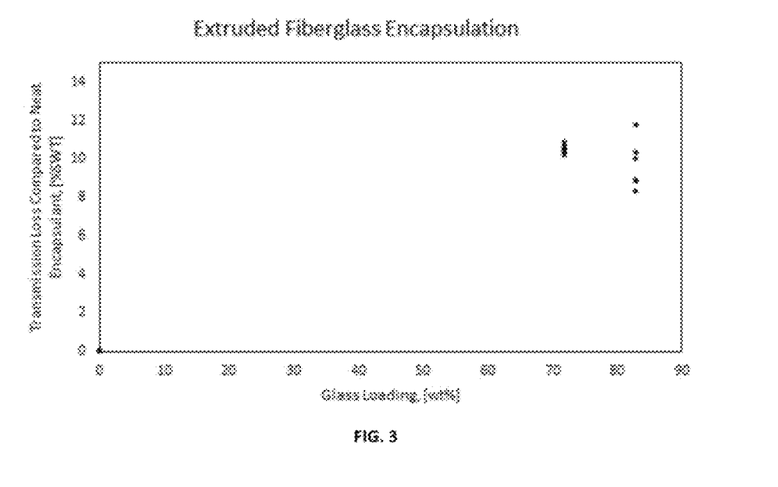
FIG. 3 depicts a graph showing the percent of optical transmission loss in polymeric continuous fiber tapes loaded with glass fiber in an amount greater than 50% by weight based on a total weight of the polymeric continuous fiber tape.

FIG. 3 depicts a graph showing the percent of optical transmission loss in samples of polymeric continuous fiber tapes loaded with glass fiber. The samples of polymeric continuous fiber tape were loaded with glass fiber in an amount greater than 50% by weight based on a total weight of the polymeric continuous fiber tape in accordance with the method described above. The amount of optical transmission for each sample was then tested using a PerkinElmer® Lambda 1050 spectrophotometer with a 270 mm integrating sphere. The obtained spectra for each sample was then weighted against the AM 1.5 standard solar spectrum. In addition, the amount of optical transmission for an encapsulant not loaded with glass fiber was obtained. The percent of optical transmission loss was obtained by comparing the optical transmission of each sample to the optical transmission of the encapsulant not loaded with glass fiber.

Variations, modifications and alterations to embodiments of the present disclosure described above will make themselves apparent to those skilled in the art. All such variations, modifications, alterations and the like are intended to fall within the spirit and scope of the present disclosure, limited solely by the appended claims.

While several embodiments of the present disclosure have been described, it is understood that these embodiments are illustrative only, and not restrictive, and that many modifications may become apparent to those of ordinary skill in the art. For example, all dimensions discussed herein are provided as examples only, and are intended to be illustrative and not restrictive.

Any feature or element that is positively identified in this description may also be specifically excluded as a feature or element of an embodiment of the present as defined in the claims.

The disclosure described herein may be practiced in the absence of any element or elements, limitation or limitations, which is not specifically disclosed herein. Thus, for example, in each instance herein, any of the terms "comprising," "consisting essentially of" and "consisting of" may be replaced with either of the other two terms, without altering their respective meanings as defined herein. The terms and expressions which have been employed are used as terms of description and not of limitation, and there is no intention in the use of such terms and expressions of excluding any equivalents of the features shown and described or portions thereof, but it is recognized that various modifications are possible within the scope of the disclosure.

What is claimed:

1. A roofing system, comprising:
a roofing surface;
a plurality of photovoltaic modules located above the roofing surface,
   wherein each of the plurality of photovoltaic modules comprises:
      a solar cell; and
a plurality of modules located above the roofing surface and adjacent the plurality of photovoltaic modules,
   wherein each of the plurality of modules comprises:
      a first layer,
         wherein the first layer comprises a thermoplastic polyolefin;
      a second layer,
         wherein the second layer comprises a continuous fiber tape; and
      a third layer,
         wherein the third layer comprises a thermoplastic polyolefin,
         wherein the second layer is between the first layer and the third layer,
         wherein the third layer is adjacent to the second layer,
   wherein each of the plurality of modules does not include a solar cell.

2. The roofing system of claim 1, wherein each of the plurality of modules further comprises:
a fourth layer.

3. The roofing system of claim 2, wherein the fourth layer comprises a continuous fiber tape.

4. The roofing system of claim 3, wherein the continuous fiber tape of the fourth layer comprises a polymer and a glass fiber.

5. The roofing system of claim 4, wherein the continuous fiber tape of the second layer comprises a polymer and a glass fiber.

6. The roofing system of claim 1, wherein the continuous fiber tape of the second layer has a thickness from 100 μm to 1000 μm.

7. The roofing system of claim 1, wherein the continuous fiber tape of the second layer has a thickness from 200 μm to 500 μm.

8. The roofing system of claim 1, wherein an optical transmission of the continuous fiber tape of the second layer is at least 80%.

9. The roofing system of claim 1, wherein an optical transmission of the continuous fiber tape of the second layer is from 80% to 95%.

10. The roofing system of claim 1, wherein the continuous fiber tape of the second layer comprises a polymer and a continuous glass fiber.

11. The roofing system of claim 10, wherein the continuous glass fiber comprises a unidirectional glass fiber.

12. The roofing system of claim 10, wherein the continuous glass fiber comprises an extruded glass fiber.

13. The roofing system of claim 1, wherein each of the plurality of modules further comprises:
a fourth layer,
   wherein the fourth layer comprises a continuous fiber tape,
      wherein the continuous fiber tape of the fourth layer comprises a polymer and a continuous glass fiber, and
         wherein the continuous glass fiber comprises at least one of a unidirectional glass fiber and an extruded glass fiber.

14. A roofing system, comprising:
a roofing surface;
a plurality of photovoltaic modules located above the roofing surface,
   wherein each of the plurality of photovoltaic modules comprises:
      a solar cell; and
a plurality of modules located above the roofing surface and adjacent the plurality of photovoltaic modules,
   wherein each of the plurality of modules comprises:
      a first layer,
         wherein the first layer comprises a polymer;
      a second layer,
         wherein the second layer comprises a continuous fiber tape,
            wherein the continuous fiber tape of the second layer comprises a polymer and a glass fiber;
      a third layer,
         wherein the third layer comprises a polymer,
         wherein the second layer is between the first layer and the third layer,
         wherein the third layer is adjacent to the second layer; and
      a fourth layer,
         wherein the fourth layer comprises a continuous fiber tape,
            wherein the continuous fiber tape of the fourth layer comprises a polymer and a glass fiber,
            wherein the third layer is between the second layer and the fourth layer,
   wherein each of the plurality of modules does not include a solar cell.

15. The roofing system of claim 14, wherein at least one of the first layer and the third layer comprises thermoplastic polyolefin.

16. The roofing system of claim 14, wherein the continuous fiber tape of the second layer has a thickness from 100 μm to 1000 μm.

17. The roofing system of claim 14, wherein the continuous fiber tape of the second layer has a thickness from 200 μm to 500 μm.

18. The roofing system of claim 14, wherein an optical transmission of the continuous fiber tape of the second layer is at least 80%.

19. The roofing system of claim 14, wherein an optical transmission of the continuous fiber tape of the second layer is from 80% to 95%.

20. The roofing system of claim 14, wherein the continuous fiber tape of the second layer comprises at least one of a unidirectional glass fiber and an extruded glass fiber.

* * * * *